Figure 1:
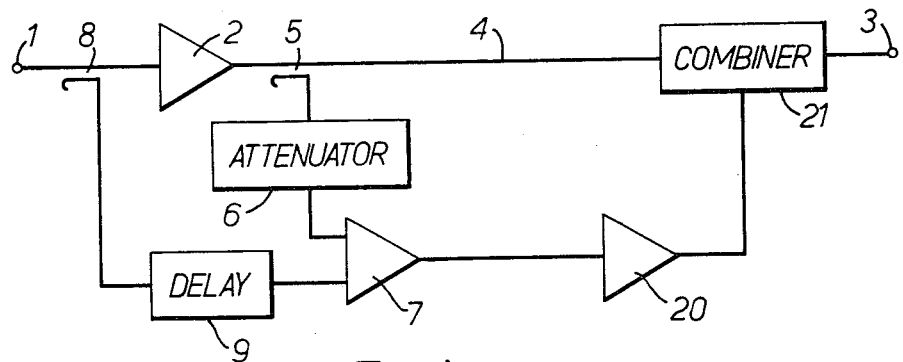

United States Patent [19]

Gerard

[11] 4,359,696

[45] Nov. 16, 1982

[54] AMPLIFIERS

[75] Inventor: Roger E. J. Gerard, Chelmsford, England

[73] Assignee: The Marconi Company Limited, Chelmsford, England

[21] Appl. No.: 177,821

[22] Filed: Aug. 13, 1980

[30] Foreign Application Priority Data

Aug. 14, 1979 [GB] United Kingdom ............... 7928256
Jul. 30, 1980 [GB] United Kingdom ............... 8024981

[51] Int. Cl.$^3$ .......................... H03F 1/32; H03F 3/68
[52] U.S. Cl. .................................... 330/151; 330/149
[58] Field of Search ............................. 330/149, 151

[56] References Cited

U.S. PATENT DOCUMENTS 1,686,792 10/1928 Black .
4,258,328 3/1981 Prevot et al. ..................... 330/149

FOREIGN PATENT DOCUMENTS 794841 5/1958 United Kingdom .
1082890 9/1967 United Kingdom .
1326348 8/1973 United Kingdom .
1519456 7/1978 United Kingdom .
1535823 12/1978 United Kingdom .

OTHER PUBLICATIONS

Bennett et al. Feedforward—An Alternative Approach to Amplifier Linearization, May 1974, Radio & Electronic Engineering, vol. 44, No. 5, pp. 257–262.

Primary Examiner—James B. Mullins
Assistant Examiner—Gene Wan
Attorney, Agent, or Firm—Spencer & Kaye

[57] ABSTRACT

A feedforward amplifier compensates for distortions introduced by a main amplifying device by comparing the amplified signal with the original unamplified signal and producing a correction signal, which is related to the difference. The correction signal is combined with the main amplified signal at a combiner. The combiner takes the form of a tetrode or pentode valve which acts as a current source and which is designed so as to constitute part of an output transmission line having a predetermined characteristic impedance. By this means the combiner does not adversely affect the main amplified signal and the capacitance inevitably associated with a tetrode or pentode valve is utilized as part of the reactance of the transmission line and does not adversely affect the frequency response of the amplifier.

3 Claims, 3 Drawing Figures

AMPLIFIERS

This invention relates to amplifiers and is specifically concerned with feedforward amplifiers. Amplifying devices such as transistors and vacuum tubes are not perfectly linear over the whole of their operating ranges and the non-linearities in their transfer characteristics introduce distortions into signals which they amplify. In order to minimise the effect of the distortions, feedforward and feedforward techniques have been used. To date, feedback amplifiers have been more commonly used. In a feedback amplifier, the output signal of an amplifying device is compared with its input and the same amplifying device is used to re-process the difference signal. Conversely a feedforward amplifier compares at the output of an amplifying device, the input signal with the output signal of the amplifying device and a separate amplifying device is used to provide a difference signal which is added by a combination in anti-phase with the output signal to minimise the distortion. The principle, feedforward is capable of providing very good results, but in practice feedback is often preferred since the performance level in this case is not critically dependent on circuit component characteristics and tolerances in the same way that is feedforward. In particular the combiner is often required to operate at very high power levels, and it has proved difficult to design a combiner which exhibits sufficient transfer characteristics and which at the same time is reasonable efficient.

According to this invention a feedforward electronic amplification system includes an amplifier; comparison means, connected between the amplifier's input and output lines downline of the amplifier for comparing the shape of the control signal downline of said amplifier with the shape of the final output signal, and for providing a difference signal indicative of any amplifier-induced distortion; correction signal generating means, coupled to the comparison means, for forming in dependence upon the difference signal a correction signal which may be used to compensate for the amplifier-induced distortion; and combiner means, connected between the correction signal generating means and the amplifier's output line downline of the connection with the comparison means, for combining the correction signal with the final output signal so as substantially to cancel the amplifier-induced distortion, the combiner forming part of a section of the said output line, and exhibiting the same characteristic impedance as the output line.

The amplifier will usually be of the thermionic valve type, and the invention is hereinafter described utilising thermionic valves. However, it will be realised by those skilled in the art that suitable semiconductor devices may be substituted for valves, and in such a case any reference herein to "anode", "cathode" and "control electrode" (or "grid") should be construed accordingly.

The comparison means compares the amplifier's output signal shape with the control (input) signal shape; any difference is attributable to amplifier-induced distortion arising primarily from the non-linearity of the amplifier. It is not practicable to compare the full output signal, and thus a sample is taken—and naturally the ouput signal is sampled downline of the amplifier; the actual sampling technique may by any that is convenient, but is preferably effected employing a directional coupler of the transformer type. Although the control signal could be similarly sampled, this would cause unnecessary difficulties in attaining a correction signal of the desired power level (as discussed in more detail hereinafter), and thus preferably the control signal downline of the amplifier is actually used itself to drive the comparison means.

The amplifier may be a single amplifying element, or instead it may be a distributed amplifier. In the case of a distributed amplifier the use of the control signal to drive the comparison means is particularly advantageous.

Not only does this save power and improve efficiency (in a conventional distributed amplifier the input line is terminated by a resistance serving merely as a power-absorbing load), but, because of the amplifier's in-built "in phase" requirement between input and output lines (the delay between each inter-valve output line section matches the delay of the relevant inter-valve input line section), this minimises the problem of ensuring good phase correspondence, which in turn simplifies the shape comparison process. Although the comparison means can be, for example, an active device—such as an operational amplifier—the most convenient form of comparison means is simply a transformer to either end of the primary coil of which are fed the output line signal sample and the control line signal respectively, and from the secondary coil of which is taken the difference signal, the primary coil being "centre"-tapped with a load connecting the coil to earth. Though in general the transformer primary winding need not be tapped so that the turns either side are equal in number (and such an asymmetric configuration might be of use in situations where, for other reasons, the power levels of the two signals are not the same), very conveniently they are so equal.

As will be understood, the impedance value of the load to earth will be chosen to match the characteristics the input line and the ratio of turns either side of the transformer primary coil tapping point.

The difference signal provided by the comparison means is supplied to the correction signal generating means which uses it to form a correction signal (a "negative"—antiphase—version of the distortion itself) suitable for combing with the amplifier's output so as to cancel the distortion therein (as detected by the comparison means). It will be necessary to amplify the difference signal in order to obtain the desired level of correction signal power, and any conventional amplification system can be used, for this purpose, as the correction signal generating means. Advantageously, however, the amplification system is preferably simply an additional low gain amplifying element (additional, that is, to those conventionally present in the distributed amplifier), together with an associated pre-amplifier, supplying its output to the combiner means.

Delays introduced into the correction signal network by virtue of the comparison means, the correction signal generating means and the combiner means per se can easily be compensated for by a matching delay built into the amplifier output line between the sampling point and the combiner means.

The invention is of particular value for use in connection with power amplifiers (that is, amplifiers where the major concern is the efficient use of the available electrical power rather than merely the quality of the amplified signal).

Figure 2:
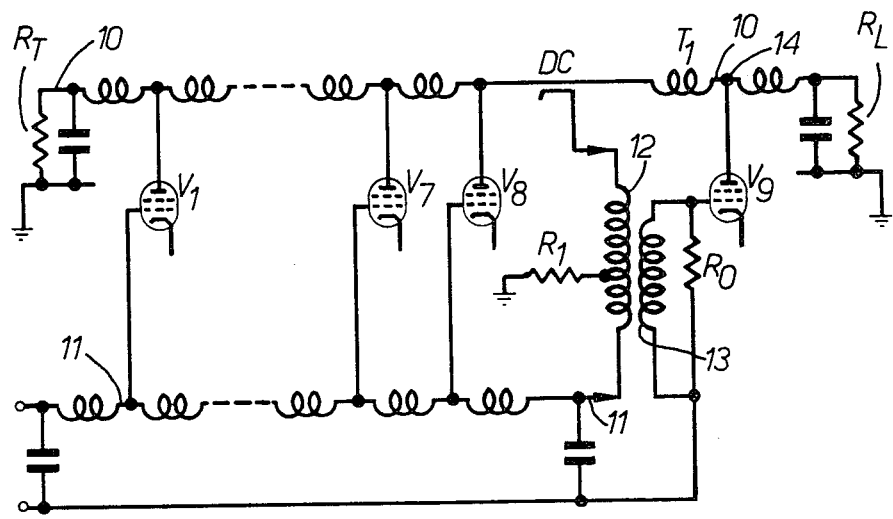
Figure 3:
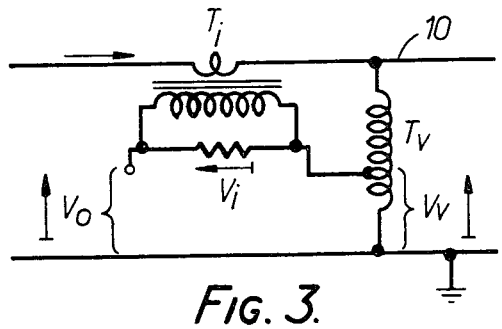

The invention will now be described, though by way of illustration only, with reference to the accompanying drawing in which, FIG. 1 shows in schematic form a feedforward amplifier in accordance with the invention, FIG. 2 shows a schematic circuit diagram of a distributed amplifier in accordance with the invention and FIG. 3 shows a schematic circuit diagram of a transformer-type directional coupler suitable for use in the circuit of FIG. 2.

An input signal which is to be amplified is received at an input terminal 1 and is passed via a main amplifier 2 to an output terminal 3. The amplifier 2 inevitably introduces distortions because of the non-linearities in its transfer characteristics. With a well designed amplifier, these distortions will be small, but even so they may be unacceptably large for some applications. It becomes increasingly more difficult to keep these distortions to acceptably low levels as the power of the amplifying system increases. In order to produce an indication of the level of these distortions, a signal derived from the output of the amplifier 2 is compared with the original input signal obtained at terminal 1. A small fraction of the output signal power of the amplifier device 2 is removed from the main signal path 4 at a directional coupler 5 and fed via an attenuator 6 to one input of a comparator 7. A small fraction of the power of the input signal is coupled via another directional coupler 8 and a delay circuit 9 to the other input of the comparator 7. The attenuator 6 provides an attenuation factor which is of exactly the same magnitude as the amplification factor provided by the amplifier 2 and the delay circuit 9 provides a delay equal to that produced by the amplifying device 2, the coupler 5 and the attenuator 6. Consequently, the two input signals to the comparator 7 are of the same amplitude and phase and the amplified output is therefore indicative of the distortion introduced by the amplifier 2, assuming that no significant distortions are introduced by the attenuator 6 or the delay circuit 9. In practice, the attenuator 6 and the delay circuit 9 are composed wholly of passive devices which can be carefully designed so as to produce insignificant distortion.

Assuming that the comparator 7 provides unity gain, its output is fed via a further inverting amplifier 20 to a combiner 21, where the amplified signal is combined with the output of the main amplifier 2. The gain of the amplifier 20 is exactly the same as that of the main amplifier 2, so that in principle the combiner 11 acts to compensate exactly for the aforementioned distortions, as the signal obtained from the amplifier 20 represents the distortions, and is fed in antiphase to the combiner 11.

The foregoing description sets out in a very brief and superficial fashion the mode of operation of a conventional feedforward amplifier. A more detailed analysis is provided in the article "Feedforward-an alternative approach to amplifier linearisation" by T. J. Bennett and R. F. Clements, The Radio and Electronic Engineer, volume 44, number 5, May, 1974.

In the distributed amplifier of FIG. 2, eight thermionic valves ($V_1$-$V_8$) are connected in a parallel sequence via their anodes to an output transmission line (10) having at one end a terminating resistance $R_T$ and connected at the other end to a load impedance $R_L$. These valves constitute the main amplifier 2 of FIG. 1. All the valves' control electrodes are connected in a parallel sequence to an input line (11). The delay between each inter-valve output line section matches the delay of the relevant inter-valve input line section; thus, all the outputs are in step with all the inputs, and so the outputs combine in an acceptable manner.

Downline of the last amplifying element ($V_8$) of the amplifier proper the output signal is sampled, using a transformer-type directional coupler (DC) described hereinafter with reference to FIG. 3, and the sample is fed to one end of the primary coil (12) of a transformer which acts as a comparator. Also downline of the last amplifying element ($V_8$) the full control signal is fed to the other end of the transformer primary coil 12. In this circuit the coil 12 is centre tapped to earth via an impedance $R_1$ (which has the values $\frac{1}{2}R_o$), the tapping point being such that the two "halves" of the coil are the same, and the power level of the sample taken by the directional coupler DC is adjusted to equal that of the control signal (and so is the highest possible, so that any subsequent amplification of the difference signal need be as low as possible).

The principle of operation of the comparison transformer is very simple. The two, theoretically-equal, signals are fed to either end of the primary coil 12. The circuit is designed so that the two signals are nominally at the same power level, any difference between the two (effectively the resultant formed by instantaneously subtracting the two signals one from the other) must be one of shape, and thus of distortion caused by the amplifier itself, and this difference—if it exists—will cause a corresponding difference signal to be induced in the transformer secondary coil (13). The number of turns of the two halves of the primary coil 12 and the secondary coil 13 are in the ratio $1:1\sqrt{2}$. This difference signal is then fed to the correction signal generating means amplifier (herein represented solely by an additional amplifying element—$V_9$—like those in the distributed amplifier), and its power level is raised to convert it into a correction signal suitable for direct combination with the output signal carried on the output transmission line 10. This correction signal is an equal power anti-phase version of the unwanted distortion enforced on the amplifier's output by its inherent design features; its combination with the output signal will cancel the distortion therefrom, and leave the output a perfectly linearly-amplified version of the original control signal. Thus the amplifying element $V_9$ provides in combination the function of the amplifier 20 and the combiner 21 of FIG. 1.

The combination of the correction signal with the amplifier output is achieved at a junction (14) between the output transmission line 10 and the amplifying element anode line under control of the amplifying element $V_9$.

The amplifying element $V_9$ is arranged to form part of a section of the output transmission line 10. The amplifying element $V_7$ is a tetrode valve which behaves as a current source in shunt with an impedance. The current flowing is, of course, that which is determined by the control signal applied to the grid of the tetrode, and provides the necessary degree of correction to compensate for the distortion introduced by the main amplifying elements. The tetrode valve inherenly includes series plate to cathode capacitance, and it is this capacitance which constitutes the capacitive element of the transmission section of the output transmission line 10 of which the tetrode valve forms a part. The series inductance of the transmission section is constituted by the inductors $T_1$ and $T_2$.

Consequently, since the amplifying element $V_9$ constitutes an integral portion of the output transmission line 10, it forms part of a transmission section which has the same characteristic impedance as the remainder of the line 10. This avoids the introduction of signal reflections at impedance discontinuities, and prevents the capacitance associated with the amplifying element $V_9$ imposing undesired frequency limitations on the performance of the amplifier as a whole. Instead this associated capacitance is utilised in a positive manner.

Because the amplifying element forms part of a matched section of the output transmission line 10, its effect on the line does not depend on the amount of correction which it provides at any moment.

The current generated at the amplifying element 9 combines with the main signal at point 14, as previously mentioned. Since the transmission line 10 exhibits the same characteristic impedance in both directions, the generated current will divide with one half flowing along the line 10 towards the load $R_L$, and the other half flowing in the reverse direction along the line 10. Because of this it is necessary to arrange that the amplifying element $V_g$ generates twice the correction current needed, since only half the current is used constructively.

Instead of a tetrode valve, a pentode valve or a transistor could be used as the amplifying element $V_9$ since they also behave as a current source—that is to say the current which is driven into point 14 is not affected to any significant extent by the voltage present at point 14.

The additional delay occasioned in the input line 11 by the transformer 12, 13 and the amplifying element $V_9$ is compensated for by the additional delay element $T_1$ built into the output line 10.

The directional coupler DC shown in FIG. 3 is a transformer-type coupler. Briefly, it operates as follows.

The output voltage ($V_o$) from this circuit is the vector sum of two other vectors ($V_v$ and $V_i$). The vector $V_v$ is a known fraction of the voltage across transformer $T_v$ (and is independent of the direction of any current flowing along line 10 through the transformer ($T_i$) primary), while the vector $V_i$ is proportional to the current flowing through the primary of $T_i$ (and so is dependent on the direction of current flow through the primary winding of transformer $T_i$).

When such a coupler is connected into a transmission line of characteristic impedance $Z_o$, with the power flowing in one direction only in that line, it is arranged that the vectors $V_v$ and $V_i$ are so proportioned that, after summation, complete cancellation occurs. Under these conditions the output ($V_o$) from the coupler is thus zero for the direction of power flow as defined (by the arrow in the Figure). However the coupler does respond to power flowing in the other direction. Hence such a circuit gives an output in response to power flowing in one direction only, and not in the other.

I claim:

1. A feedforward electronic amplification system including an amplifier; comparison means, connected between the amplifier's input and output lines downline of the amplifier, for comparing the shape of the control signal downline of said amplifier with the shape of the final output signal, and for providing a difference signal indicative of any amplifier-induced distortion; correction signal generating means, coupled to the comparison means, for forming in dependence upon the difference signal a correction signal which may be used to compensate for the amplifier-induced distortion; and combiner means, connected between the correction signal generating means and the amplifier's output line downline of the connection with the comparison means, for combining the correction signal with the final output signal so as substantially to cancel the amplifier-induced distortion, the combiner forming part of a section of the said output line, and exhibiting the same characteristic impedance as the output line, said combiner including an amplifying device arranged to operate as a variable current source.

2. A system as claimed in claim 1 and wherein said amplifying device is a tetrode valve or pentode valve.

3. A system as claimed in claim 2 and wherein the plate capacitance of the valve constitutes the shunt reactance of the section of the said output line of which it forms a part.

* * * * *